(12) United States Patent
Takada

(10) Patent No.: US 6,498,997 B1
(45) Date of Patent: Dec. 24, 2002

(54) METHOD AND APPARATUS FOR PRODUCING A SOLID ACTUATOR AND MEDIUM STORING A PROGRAM FOR CONTROLLING THE SAME

(75) Inventor: Akihiko Takada, Tokyo (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 09/136,303

(22) Filed: Aug. 19, 1998

(30) Foreign Application Priority Data

Aug. 20, 1997 (JP) .............................................. 9-223356

(51) Int. Cl.⁷ .............................................. G01R 31/04
(52) U.S. Cl. ........................ 702/108; 702/117; 702/65; 702/58; 702/59; 324/538
(58) Field of Search ............................. 702/108, 33–36, 702/38–40, 57, 59, 64, 65, 117–124, 127, 182–185, 189, 193, 81–84, FOR 103–FOR 106, FOR 134, FOR 135, FOR 137, FOR 147, FOR 155, FOR 170, FOR 171; 324/763, 765, 766, 158.1, 754, 755, 538, 72.5, 73.1, 519, 537, 600, 715, 718, 722, 727; 700/109, 110, 117–121; 73/582, 588, 598, 600, 579, 602; 438/6, 10, 14, 17, 18, 21, 455, FOR 142, 11; 347/50, 57, 71; 29/890.1, 840–843, 846, 849, 850, 854, 860, 831–832, 593, 739, 740; 361/767, 772, 773, 764, 762; 228/1.1, 44.7, 179.1, 180.5, 180.1, 180.21, 103

(56) References Cited

U.S. PATENT DOCUMENTS 4,812,742 A * 3/1989 Abel et al. .................. 324/538
4,859,952 A * 8/1989 Wissell ........................ 324/538
5,153,507 A * 10/1992 Fong et al. .................... 438/18
5,712,570 A * 1/1998 Heo et al. .................... 324/538
5,933,169 A * 8/1999 Sugahara ...................... 347/71
5,949,241 A * 9/1999 Akram et al. ................ 324/765
6,087,842 A * 7/2000 Parker et al. ................ 324/763

FOREIGN PATENT DOCUMENTS

| JP | 57-138150 | 8/1982 |
| JP | 61-12040 | 1/1986 |
| JP | 61-148829 | 7/1986 |
| JP | 7-130797 | 5/1995 |

* cited by examiner

Primary Examiner—Hal Wachsman
(74) Attorney, Agent, or Firm—Morgan, Lewis & Bockius LLP

(57) ABSTRACT

A method and an apparatus for producing a solid actuator employing measurement of the electric characteristic of the actuator and effecting polarization during the wire bonding process. After a wire has been bonded to pads formed on a substrate, the conduction of the wire is tested. Then, whether or not a capacitance between the pads has a preselected value is determined. Subsequently, whether or not a characteristic impedance between the pads has a preselected value is determined. Thereafter, whether or not any crack is present in the surfaces of electrodes electrically connected to the pads is determined. This is followed by the polarization of the substrate. Electrical characteristics are tested after each wire is bonded. There is also provided a storage medium storing a program for controlling the above apparatus.

79 Claims, 12 Drawing Sheets

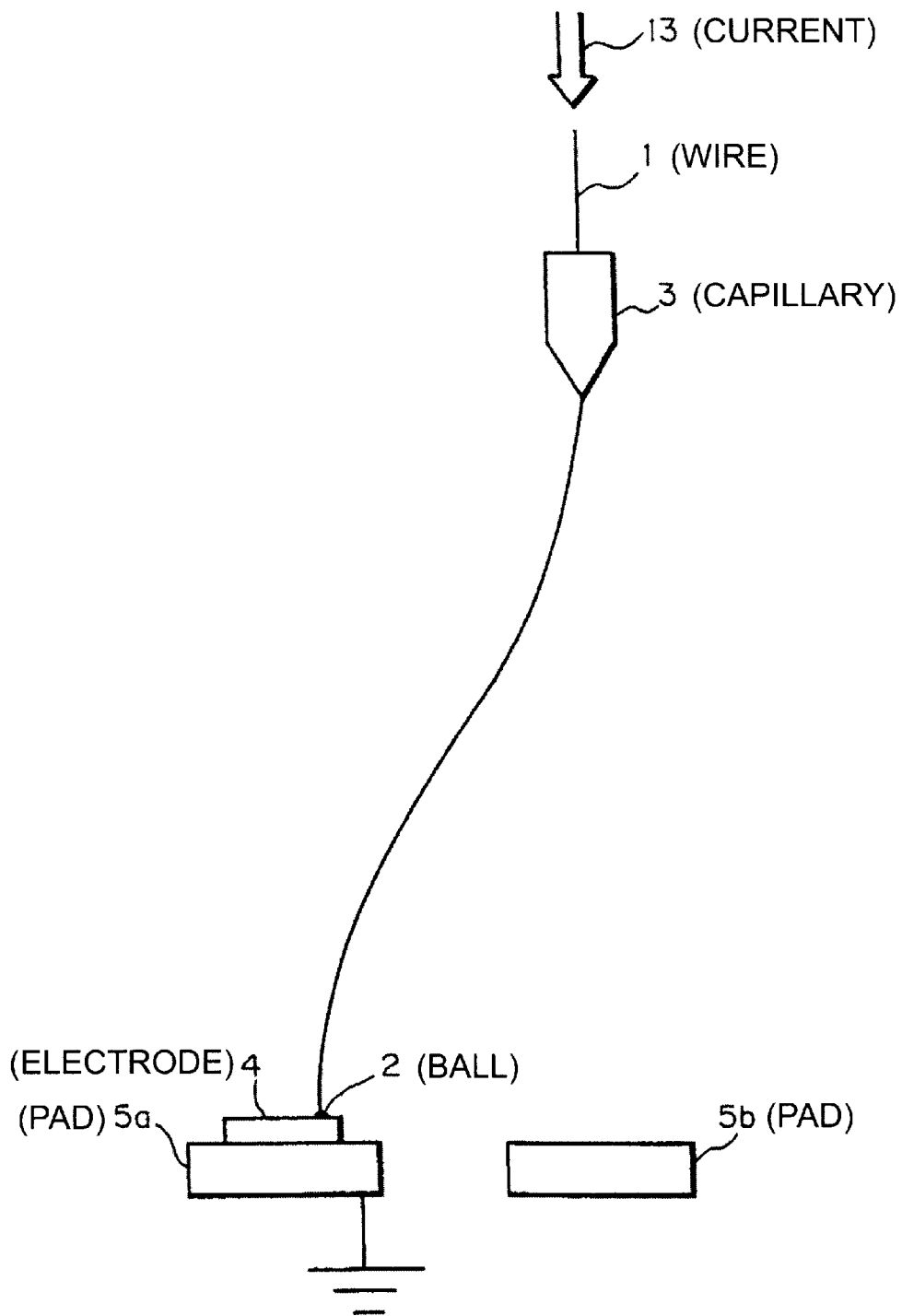

11a (GROOVES 11a–11g), 11b, 11c, 11d, 13 (SUBSTRATE), 11e, 11f, 11g
10 (COVER)

10 (COVER)
11c (GROOVES 11c–11g), 11d, 11e, 11f, 11g
y (DIRECTION OF POLARIZATION)

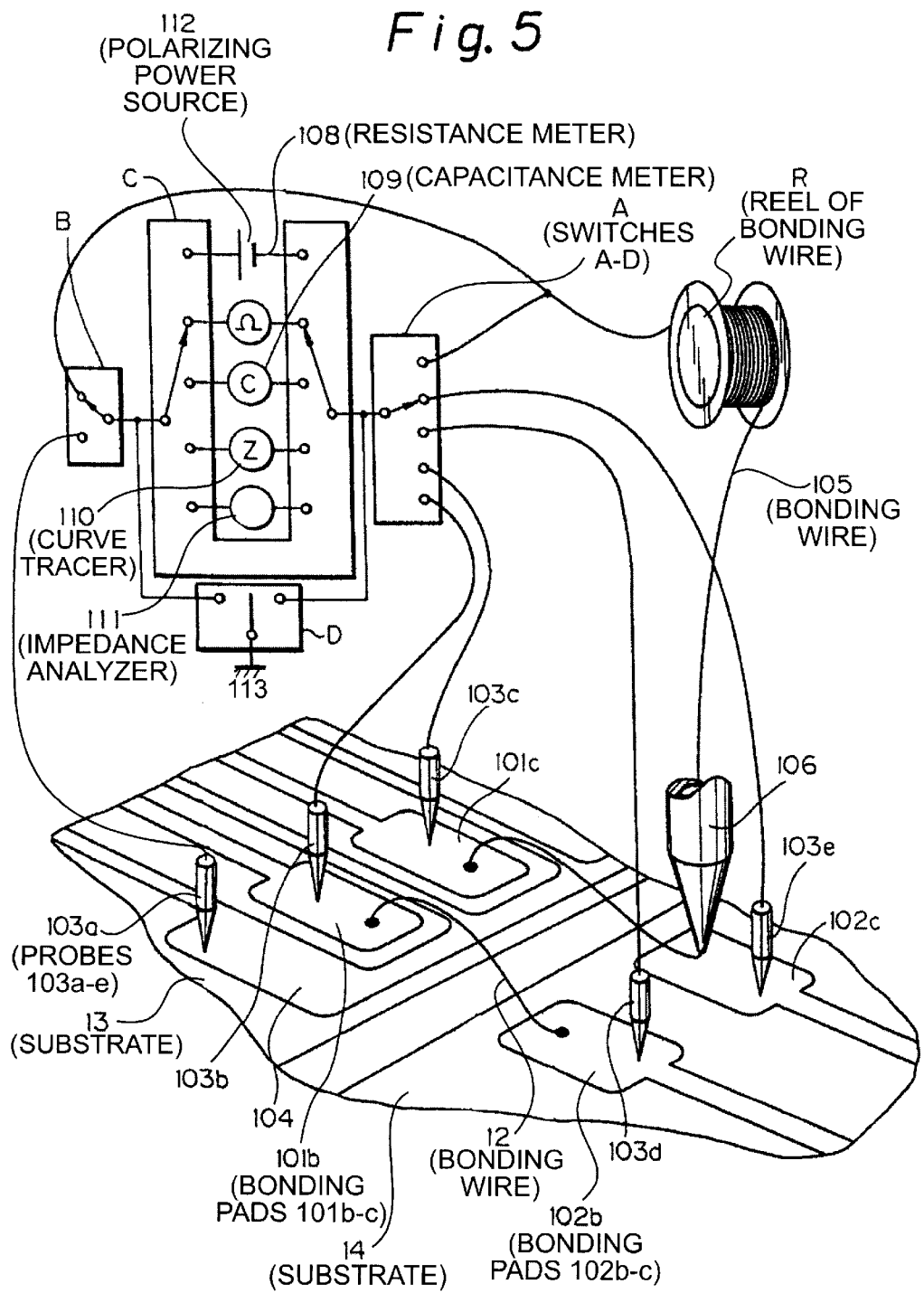

US 6,498,997 B1

METHOD AND APPARATUS FOR PRODUCING A SOLID ACTUATOR AND MEDIUM STORING A PROGRAM FOR CONTROLLING THE SAME

BACKGROUND OF THE INVENTION

The present invention relates to a method and an apparatus for producing a solid actuator, and a medium storing a control program for controlling the apparatus. More particularly, the present invention is concerned with a method and an apparatus for producing a head included in an ink jet printer, and a medium storing a control program for controlling the apparatus.

It is a common practice with the production of a semiconductor device to test the conduction of bonding wires after a wire bonding step. Japanese Patent Laid-Open Publication No. 61-12040, for example, teaches a technique for detecting the defective connection of bonding wires to a semiconductor chip.

Typical of a solid actuator is a head included in an ink jet printer. Generally, the head has a number of grooves and bonding pads formed on its substrate. The walls of the grooves are coated with electrode layers which are electrically connected to the bonding pads by bonding wires.

Assume that the conventional wire bonding technology is applied to the electrical connection of the head of an ink jet printer. Then, only electrical conduction of a probe contacting the wire of a wire bonding device and a bonding pad is tested, so that the electrical characteristic of the head or solid state actuator must be measured again. Further, when the head or similar solid actuator is formed of a piezoelectric material, an extra step is needed for aligning the molecules of the material by applying a voltage.

Technologies relating to the present invention are also disclosed in, e.g., Japanese Patent Laid-Open Publication Nos. 57-138150, 61-148829, and 7-130797.

SUMMARY OF THE INVENTION

It is therefore an object of the present invention to provide a method and an apparatus for producing a solid actuator without resorting to repeated measurement of the electrical characteristic of the actuator and eliminating the need for an extra step for polarization.

In accordance with the present invention, an apparatus for producing a solid actuator includes a bonding device for bonding a wire to a first pad and a second pad formed on a substrate of the solid actuator. A conduction testing device tests the conduction of the wire connecting the first and second pads. A capacity testing device determines, after a conduction test effected by the conduction testing device, whether or not a capacity between the first and second pads and a ground pad has a preselected value.

DESCRIPTION OF THE DRAWINGS

The above and other objects, features and advantages of the present invention will become apparent from the following detailed description taken with the accompanying drawings in which:

FIG. 1 shows a conventional procedure for detecting the defective bonding of a semiconductor chip;

FIG. 5 shows an essential part of an apparatus for producing a solid actuator embodying the present invention;

Figure 2A:
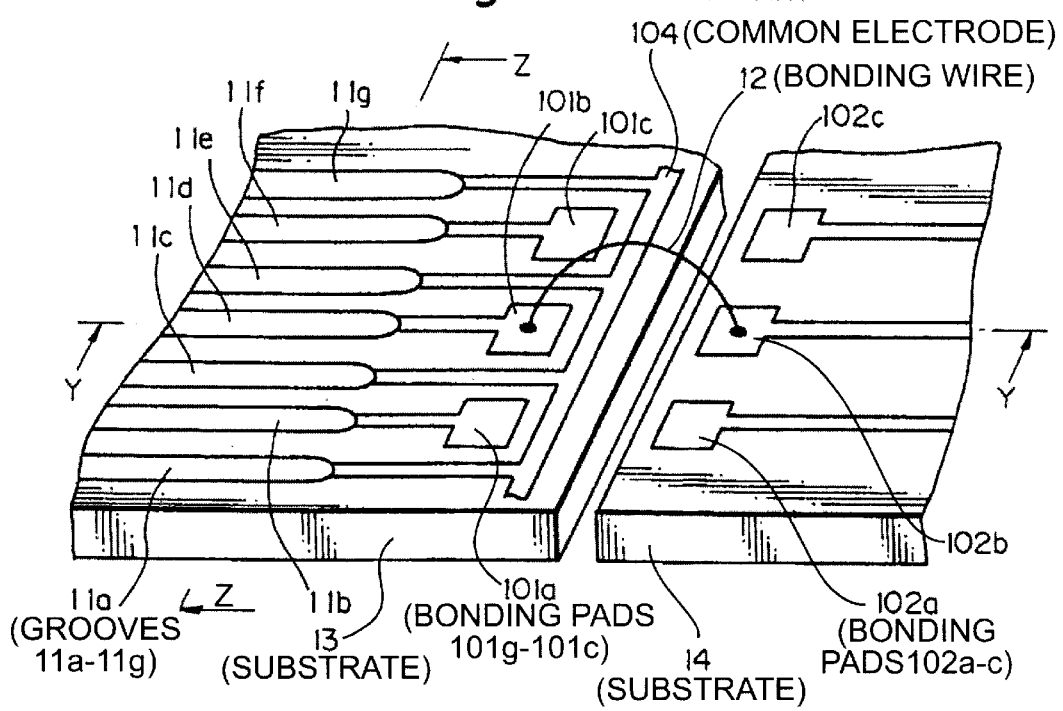
FIG. 2A is an external perspective view of a head included in an ink jet printer.

In the drawings, identical references denote identical structural elements.

DESCRIPTION OF THE PREFERRED EMBODIMENT

To better understand the present invention, brief reference will be made to a conventional technique for detecting the defective bonding of a semiconductor chips, shown in FIG. 1. As shown, a ball 2 is first bonded to an electrode formed on a semiconductor chip 4, thereby bonding one end of a wire 1 to the chip 4 (first bonding hereinafter). There are also shown in FIG. 1 leads (pads) 5a and 5b and a capillary 3.

After the first bonding, the capillary 3 is moved toward the lead 5b in order to effect second bonding. In parallel with the movement of the capillary 3, the lead 5a is connected to ground, and then a current 13 is fed via the other end of the wire 1 for testing the characteristic of the chip 4, i.e., whether or not electrical conduction has been set up between the wire 1 and the chip 4. This conduction test ends in a short period of time and can therefore be completed between the first bonding and the second bonding.

FIG. 2A shows a conventional head for use in an ink jet printer and belonging to a family of solid actuators. As shown, the head includes a substrate 13 formed with grooves 11a–11g in its surface. The grooves 11a–11g each has its wall coated with an electrode layer, not shown. Bonding pads 101a–101c are formed on the surface of the substrate 13. The electrode formed in the groove 11b is electrically connected to the bonding pad 101a. Likewise, the electrodes of the grooves 11d and 11b are electrically connected to the bonding pads 101b and 101c, respectively. The other grooves 11a, 11c, 11e and 11g are electrically connected to a common electrode 104.

Another substrate 14 is provided with bonding pads 102a–102c respectively corresponding to the bonding pads 101a–101c of the substrate 13. The bonding pads 102a–102c are electrically connected to the bonding pads 101a–101c, respectively. For example, the pad 101b is connected to the pad 102b by a bonding wire 12.

Figure 2B:
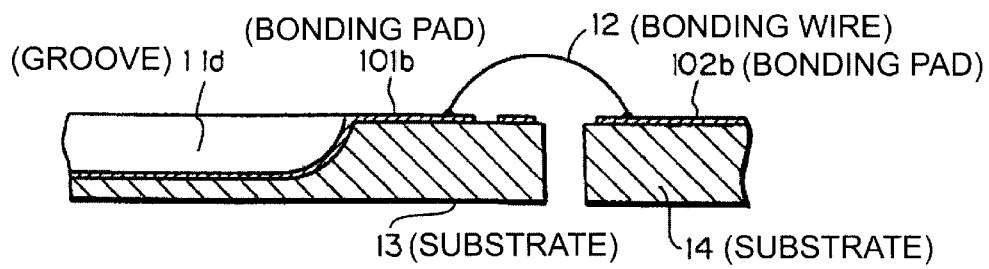
FIGS. 2B and 2C are sections each showing the head of FIG. 2A in a particular condition.
Figure 2C:
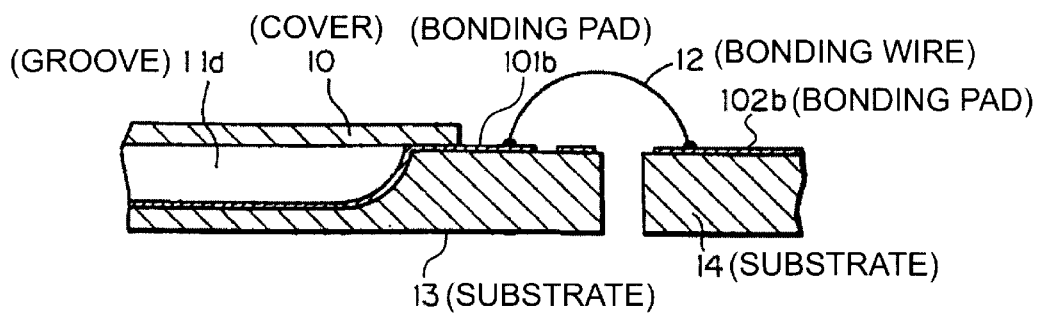
Figure 3:
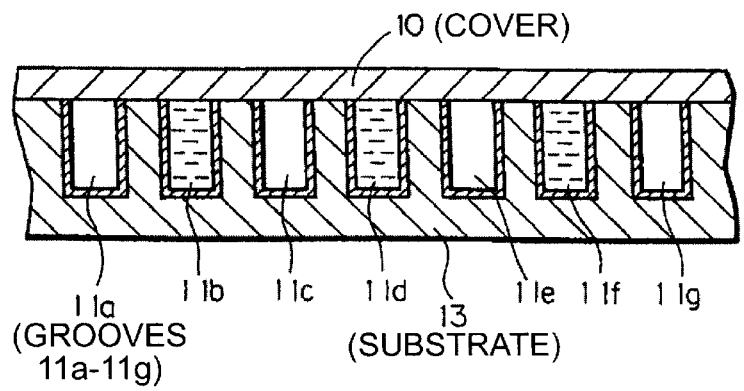
FIG. 3 is a section showing the head filled with ink.

Specifically, as shown in FIG. 2B which is a section along Y—Y of FIG. 2A, the electrode of the groove 11d is electrically connected to the bonding pad 101b which is, in turn, connected to the bonding pad 102b of the substrate 14 by the bonding wire 12. A cover 10 is mounted on the substrate 13 above the grooves 11a–11g, forming ink pressure chambers. FIG. 3 is a section along line Z—Z of FIG. 2A, showing the ink pressure chambers closed by the cover 10. As shown, ink is filled in the grooves 11a–11g alternately. That is, ink is filled in the grooves 11b, 11d and 11e.

When a preselected voltage is applied between the common electrode and the bonding pad 101b, opposite walls delimiting the groove 11d, i.e., the wall between the grooves 11d and 11c and the wall between the grooves 11d and 11e are compressed. As a result, the volume of the ink groove or ink pressure chamber 11d is reduced, causing the ink to be ejected from the chamber 11d. The ink ejected from the chamber 11d forms a dot on a paper or similar recording medium, not shown.

Figure 4A:
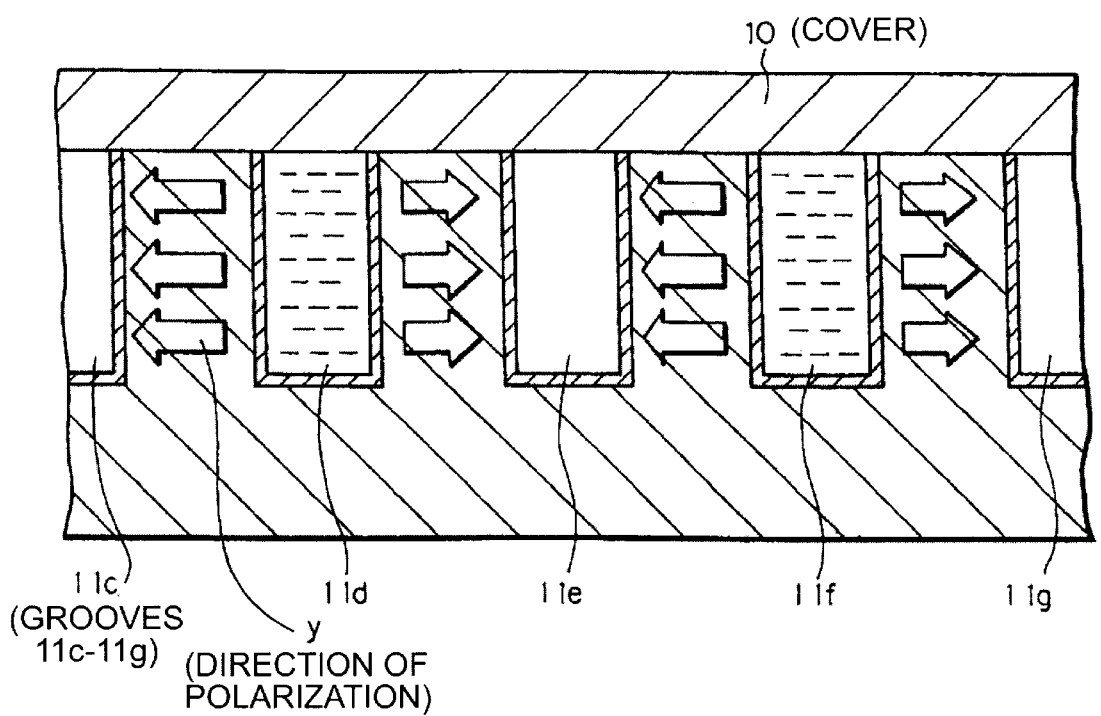
FIGS. 4A and 4B are sections showing how the head is polarized.
Figure 4B:
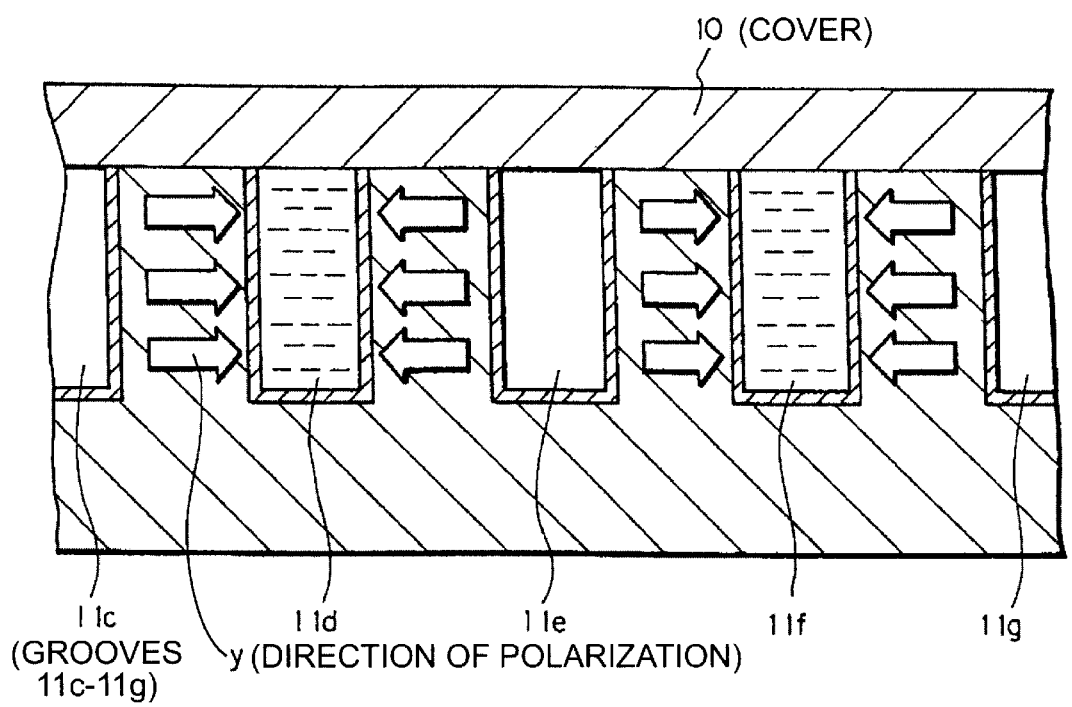

When the substrate 13 is formed of a piezoelectric material, the substrate 13 is assumed to be polarized in a direction y indicated by arrows in FIGS. 4A and 4B.

The conventional wire bonding technique stated with reference to FIG. 1 brings about the previously discussed problems when applied to the production of the head of an ink jet printer.

Referring to FIG. 5, an apparatus for producing a solid actuator embodying the present invention will be described. As shown, the apparatus includes switches A–D controlled by a controller, which will be described later, and a reel R around which a bonding wire 105 is wound.

The switch A switches electrical connection between probes 103b–103e and bonding wire 105 and the switches B and D. The switch B switches electrical connection between the bonding wire 105 and probe 103a and the switch C. The switch C switches electrical connection between a resistance meter 108, a capacity meter 109, an impedance analyzer 110 and a curve tracer 111 and a polarizing power source 112 and the switches A and B. The switch D switches electrical connection between the switches A–C and a ground potential 113. By operating the four switches A–D, it is possible to implement four different kinds of electrical connection shown in FIGS. 6–9.

Figure 6:
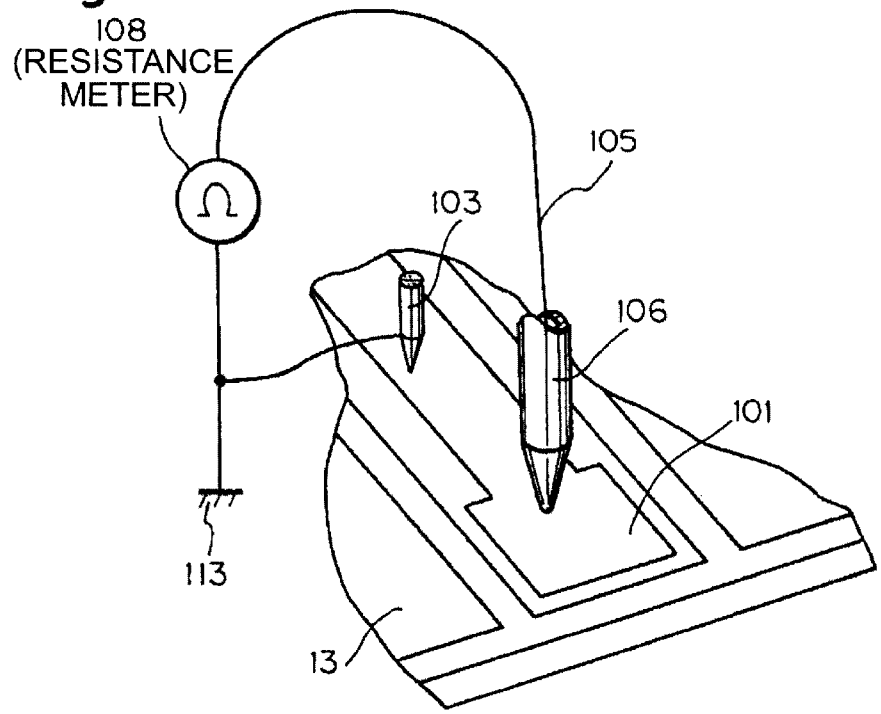
FIG. 6 shows a first bonding step.

FIG. 6 shows a first bonding step. As shown, a probe 103 is electrically connected to a bonding pad 101 formed on the front surface of a substrate 13. Also, the probe 103 is connected to the ground potential 113 and one end of the resistance meter 108. The other end of the resistance meter 108 is electrically connected to the bonding wire 105. To set up this condition, the switches A and C are so operated as to electrically connect the probe and resistance meter 108 shown in FIG. 5. Further, the switches B and C are so operated as to electrically connect the resistance meter 108 and bonding wire 105 shown in FIG. 5. The the switch D is so operated as to electrically connect, if necessary, the probe 103a and ground potential 113.

In the condition shown in FIG. 6, the end of the bonding wire 105 is electrically connected to the bonding pad 101c by a wire bonding technique. At this instant, if the resistance indicated by the resistance meter 108 drops from high resistance to almost zero, then the connection of the wire 105 to the pad 101c is determined to be successful.

Figure 7:
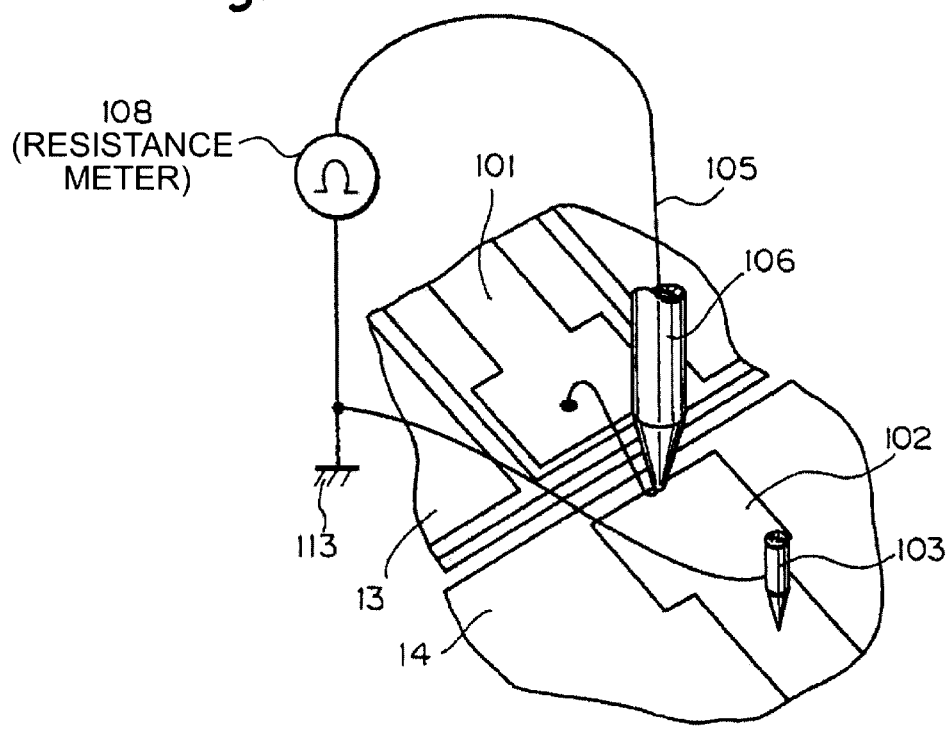
FIG. 7 shows a second bonding step.

FIG. 7 shows a second bonding step following the first bonding step. As shown, the probe 103 is electrically connected to a bonding pad 102 formed on a substrate 14 and is connected to the ground potential 113 and one end of the resistance meter 108. The other end of the resistance meter 108 is electrically connected to the bonding wire 105. To set up this condition, the switches A and C are controlled to electrically connect the probe 103e and resistance meter 108 shown in FIG. 5. The switches B and C are controlled to electrically connect the resistance meter 108 and bonding wire 105. The switch D is controlled to electrically connect, if necessary, the probe 103e and ground potential 113. In this condition, the intermediate portion of the bonding wire 105 is electrically connected to the bonding pad 102c by the wire bonding technique. At this instant, if the resistance indicated by the resistance meter 108 drops from infinite to zero, then the connection of the wire 105 to the pad 102c is determined to be successful.

Figure 8:
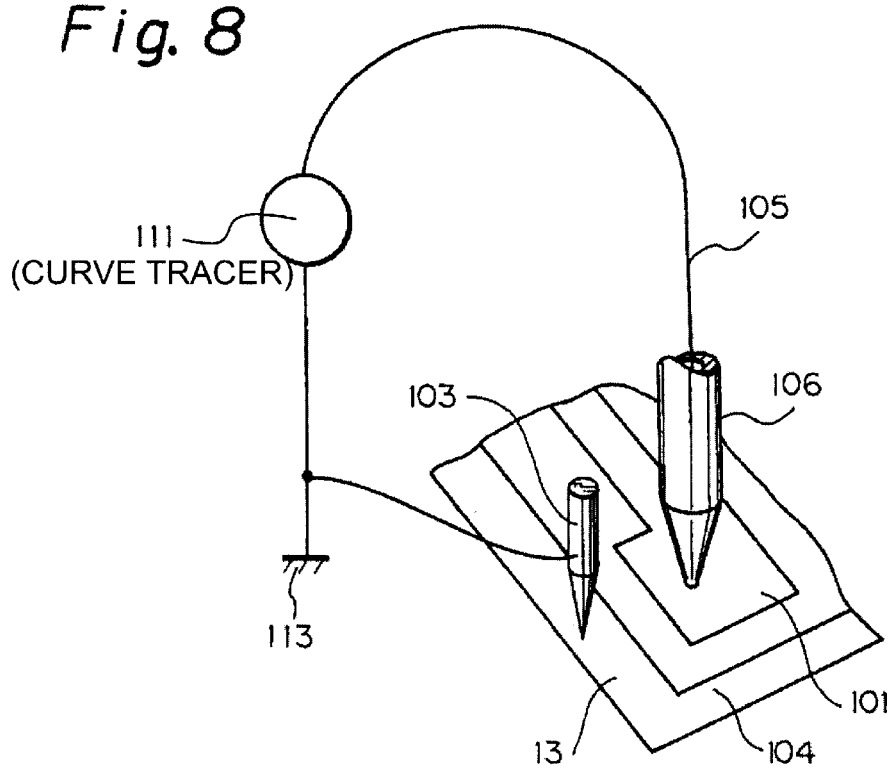
FIG. 8 shows a crack test.

FIG. 8 shows a crack test effected after the second bonding. As shown, the probe 103 is electrically connected to a common electrode 104 formed on the substrate 13 and is connected to the ground potential 113 and one end of the curve tracer 111. The other end of the curve tracer 111 is electrically connected to the bonding wire 105. To set up this condition, the switches B and C are so operated as to electrically connect the probe 103a and curve tracer 111 shown in FIG. 5, The switches A and B are so operated as to electrically connect the curve tracer 111 and bonding wire 105. The switch D is so operated as to electrically connect, if necessary, the probe 103a and ground potential 113.

In the condition shown in FIG. 8, the input/output characteristic of a high frequency signal is measured by the curve tracer 111 in order to determine whether or not any crack has occurred in the surface of the individual bonding pad or electrode of the solid actuator. Specifically, if the bonding pad is free from cracks, then a waveform representative of the input/output characteristic of the high frequency signal is uniform because of impedance matching. If any crack has occurred in the pad, then the above waveform is disturbed because impedance matching is not set up. With the curve tracer 111, therefore, it is possible to determine whether or not any crack has occurred in the solid state actuator.

After the above crack test, the actuator is disconnected from the curve tracer 111 and connected to the capacity meter 109 and impedance analyzer in order to check the characteristic of the actuator again. This can be done if the switch C is operated to change the electrical connection.

Figure 9:
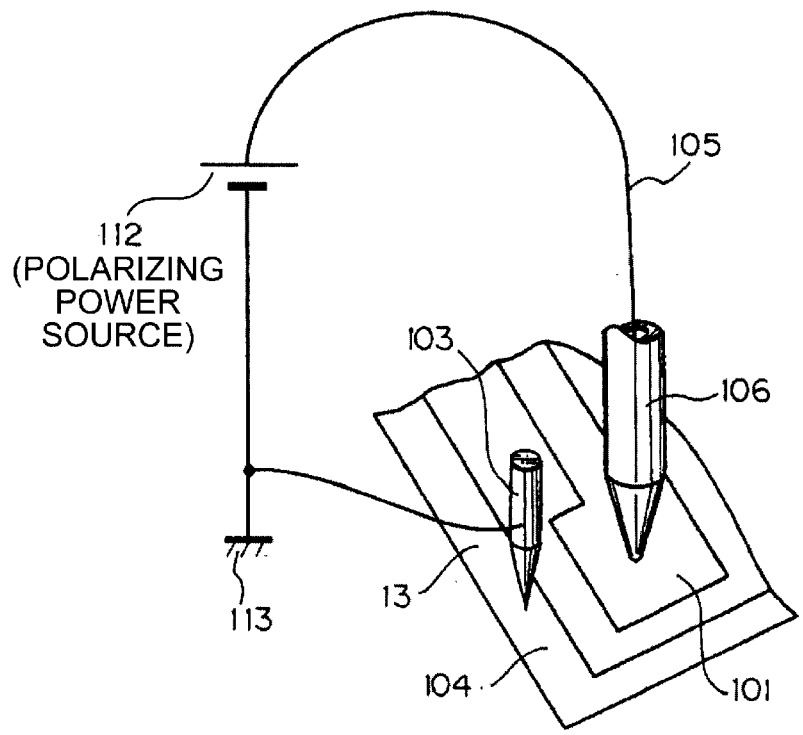
FIG. 9 shows a polarizing step.

Finally, as shown in FIG. 9, the polarizing power source 112 is connected for polarizing the solid actuator. Specifically, the probe 103 is electrically connected to the common electrode of the substrate 13, ground potential 113, and one end of the polarizing power source 112. The other end of the power source 112 is electrically connected to the bonding wire 105. To set up this condition, the switches B and C are so operated as to electrically connected the probe 103a and power source 112 shown in FIG. 5. The switches A and B are so operated as to electrically connect the power source 112 and bonding wire 105. The switch D is so operated as to connect, if necessary, the probe 103a and ground potential 113.

In the condition shown in FIG. 9, an electric field formed by the polarizing power source 112 aligns the molecules of the piezoelectric material in the direction stated with reference to FIG. 4. It is to be noted that such polarization using the polarizing power source 112 is not necessary if the actuator is not formed of a piezoelectric material.

Figure 10A:
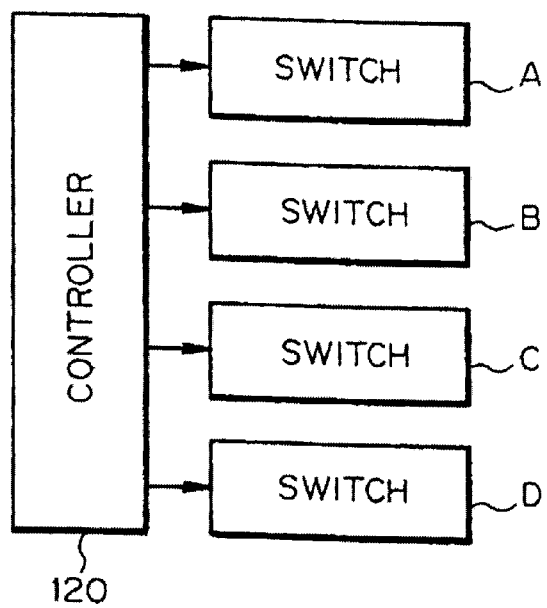
FIGS. 10A and 10B are block diagrams each showing a specific connection between switches and a controller included in the illustrative embodiment.

FIG. 10A shows a controller 120 for controlling the switches A–D in the consecutive steps shown and described. As shown, the controller 120 sends control signals to the switches A–D. In response, the switches A–D each changes the electrical connection of the respective contacts. The control signals are necessary for implementing a procedure to be described with reference to FIGS. 11–14.

Figure 10B:
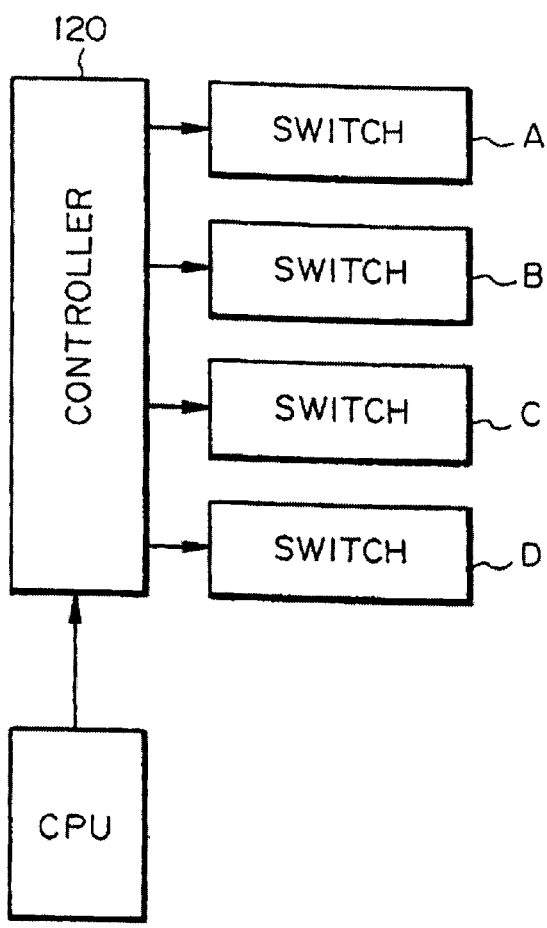

Alternatively, as shown in FIG. 10B, a CPU (Central Processing Unit) 121 may control the switches A–D via the controller 120. In this case, the controller 120 sends the control signals to the switches A–D in response to a command received from the CPU 121. These control signals are also necessary for implementing the procedure of FIGS. 11–14.

Figure 11:
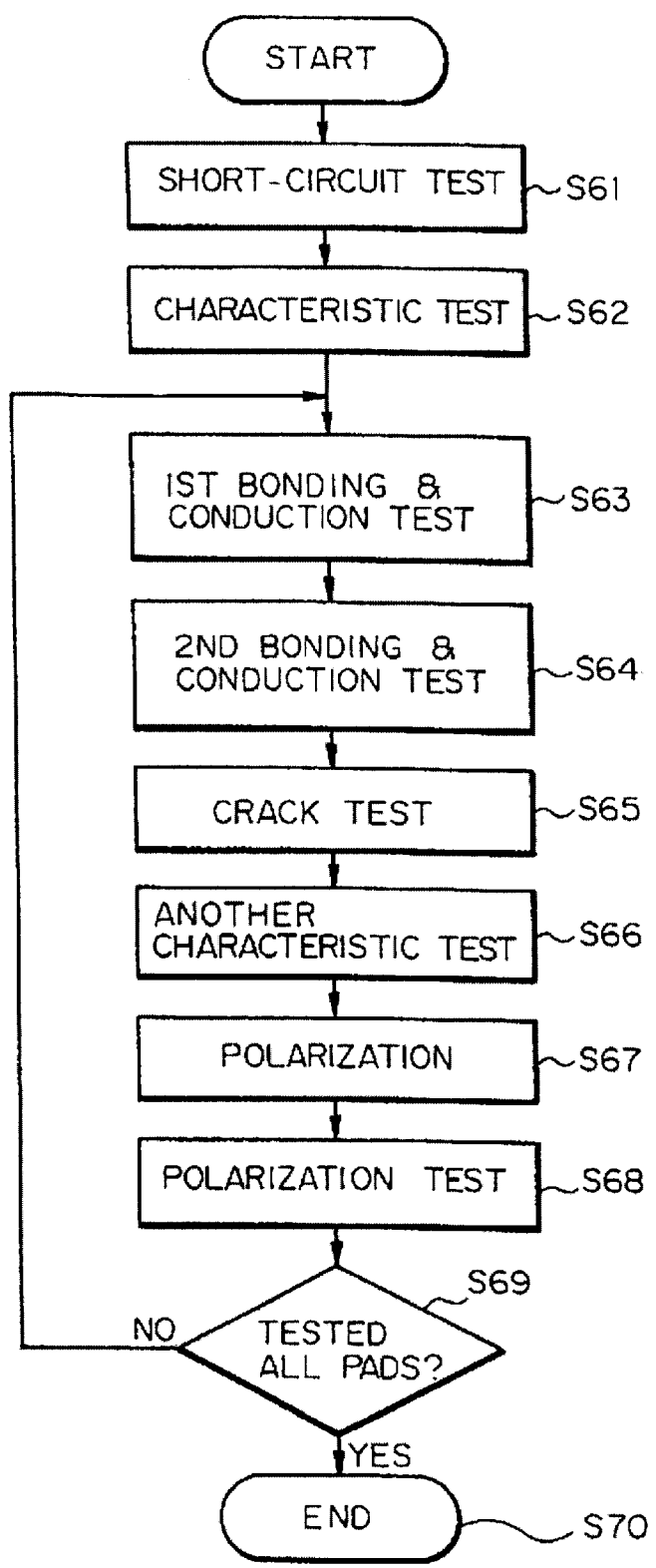
FIG. 11 is a flowchart showing a specific main routine particular to the illustrative embodiment.

A specific operation of the illustrative embodiment will be described with reference to FIGS. 11–14. FIG. 11 shows a main routine particular to the illustrative embodiment. As shown, the main routine begins with a step S61 for effecting a short-circuit test using the resistance meter 108. The step S61 will be described specifically later with reference to FIG. 12. After the step S61, the capacity and characteristic impedance of the solid actuator are determined by use of the capacity meter 109 and impedance analyzer 110, respectively (step S62), as will be described specifically later with reference to FIG. 13. Of course, the step S62 may be effected before the step S61, if desired.

After the testing steps S61 and S62, the first bonding and conduction test are executed in the condition shown in FIG. 6 (step S63). Then, the second bonding and conduction test are executed in the condition shown in FIG. 7 (step S64). If the result of the conduction test effected in the step S64 is satisfactory, then whether or not cracks are present in the electrode layers is determined (step S65). If the electrode layers is free from cracks, then the capacity and characteristic impedance are again tested (step S66). Assume that the result of the step S66 is satisfactory, and that the solid actuator is formed of a piezoelectric material. Then, the step S66 is followed by polarization (step S67) and a test for estimating the polarization (step S68).

The above steps S63–68 are executed with all of the bonding pads. That is, when the steps S63–68 are not executed with all of the bonding pads (N, step S69), the program returns to the step S63. The program ends (step S70) when the answer of the step S69 is positive (Y). The steps S63–S69 will be described specifically later with reference to FIG. 14.

Figure 12:
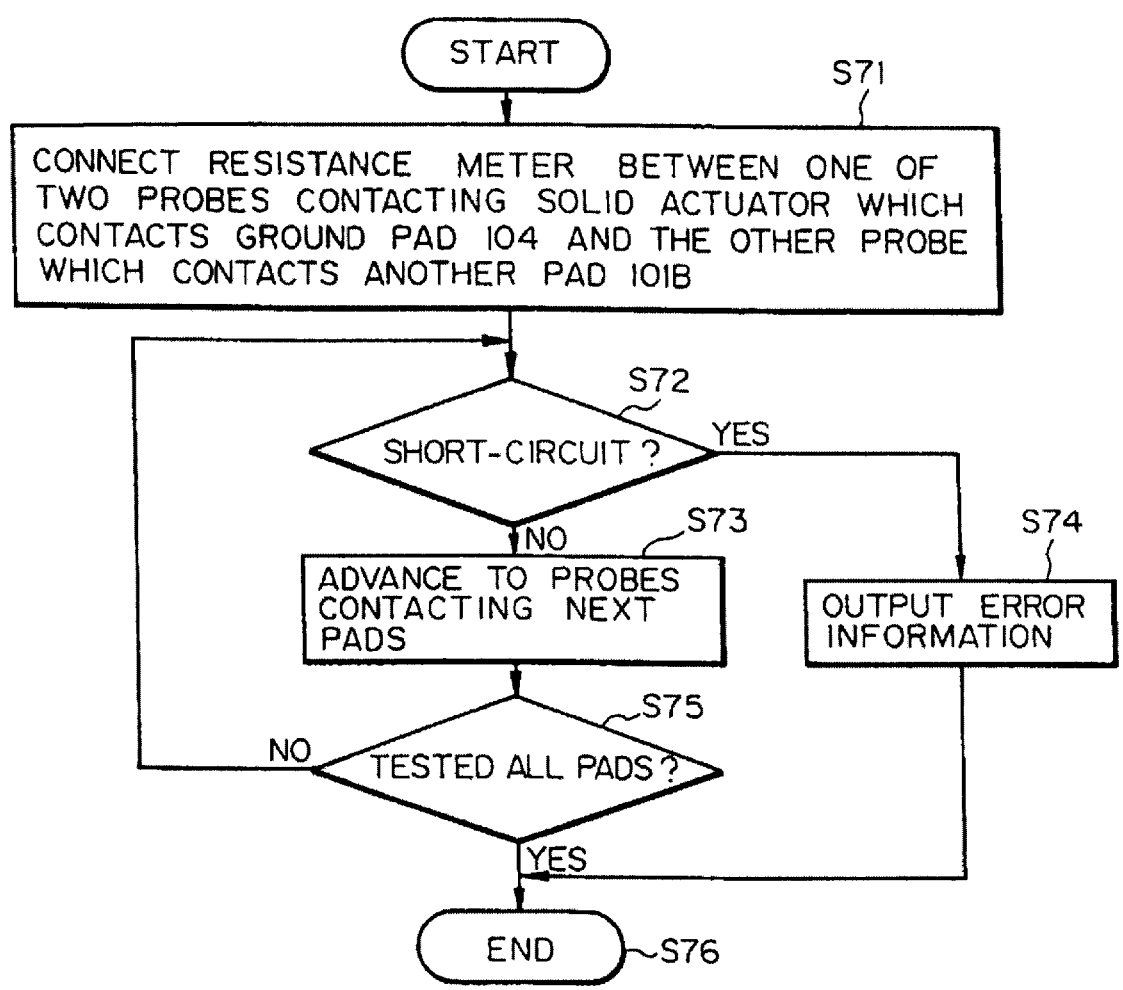
FIGS. 12–14 are flowcharts each showing a particular part of the main routine of FIG. 11 in detail.

The short-circuit test (step S61) will be described with reference to FIG. 12. As shown, one of two probes contacting the solid actuator is brought into contact with the ground pad 104 while the other probe is brought into contact with another pad 101b. Specifically, the switches A–D are operated to connect the resistance meter between the electrode layers of two nearby grooves (step S71). If the electrode layers of the two grooves are not short-circuited (N, step S72), then the next two nearby grooves are tested as to short-circuiting (step S73). If the nearby grooves are short-circuited (Y, step S72), then the procedure ends while outputting error information (steps S74 and S76). After the step S73, whether or not the short-circuit test has been executed with all of the contacts, or pads, is determined (step S75). If the answer of the step S75 is Y, the program ends (step S76); if otherwise, the program returns to the step S72.

Figure 13:
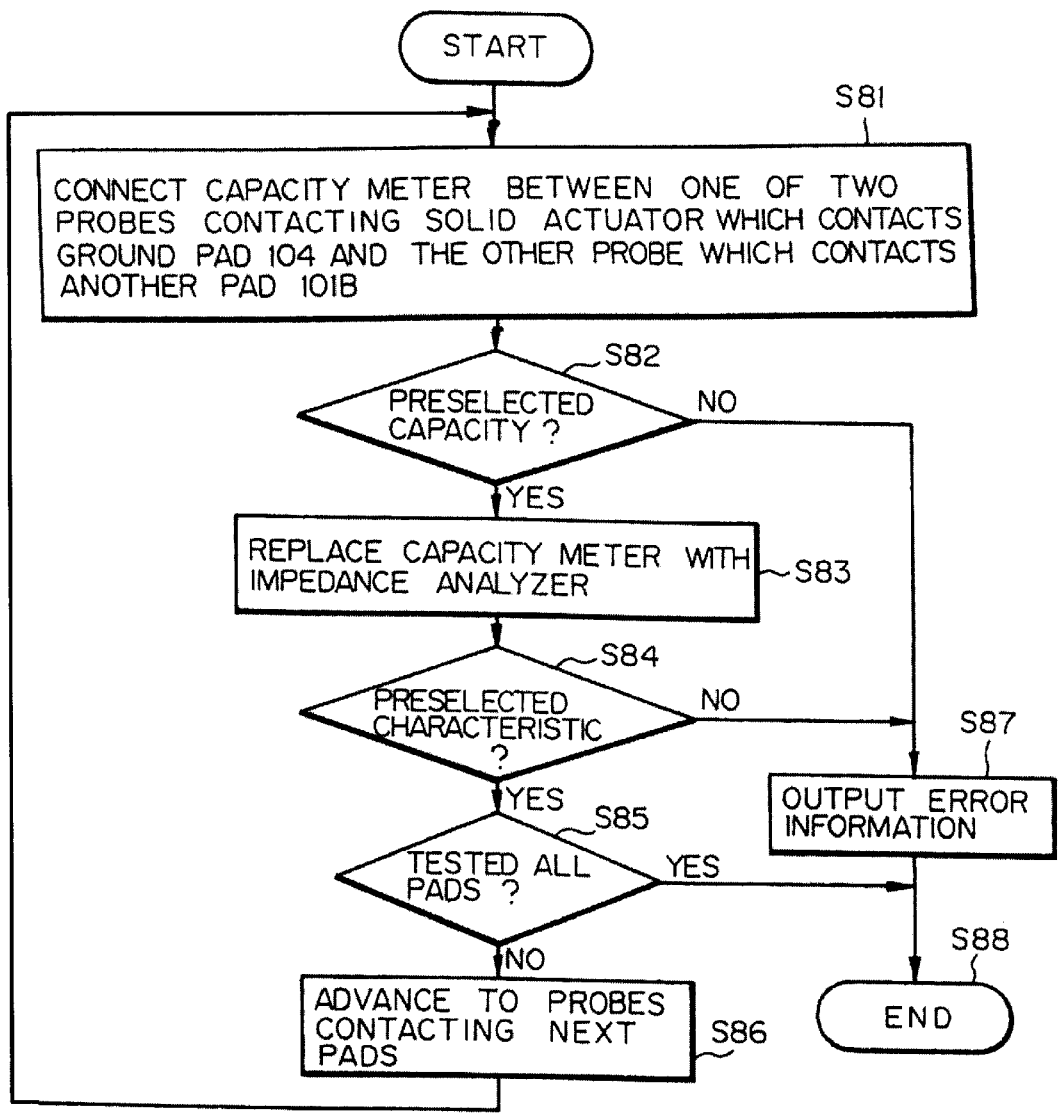

FIG. 13 shows the characteristic test (step S62) in detail. As shown, one of two probes contacting the solid actuator is brought into contact with the ground pad 104 while the other probe is brought into contact with another pad 101b. Specifically, the switches A–D are operated to connect the capacity meter between the electrode layers of two nearby grooves (step S81). Then, whether or not a measured capacity has a preselected value is determined (step S82). If the answer of the step S82 is Y, then the switches A–D are so operated as to connect the impedance analyzer in place of the capacity meter (step S83). Whether or not a measured characteristic impedance has a preselected value is determined (step S84). If the answer of the step S84 is Y, then the electrode layers of the next two grooves, i.e., the next probe 103c is tested (steps S5 and S86). If the test has been executed with all of the probes or pads (Y, step S85), then the procedure ends (step S88). If the answer of the step S82 or S84 is N, then the procedure also ends (step S88) while producing error information.

Figure 14:
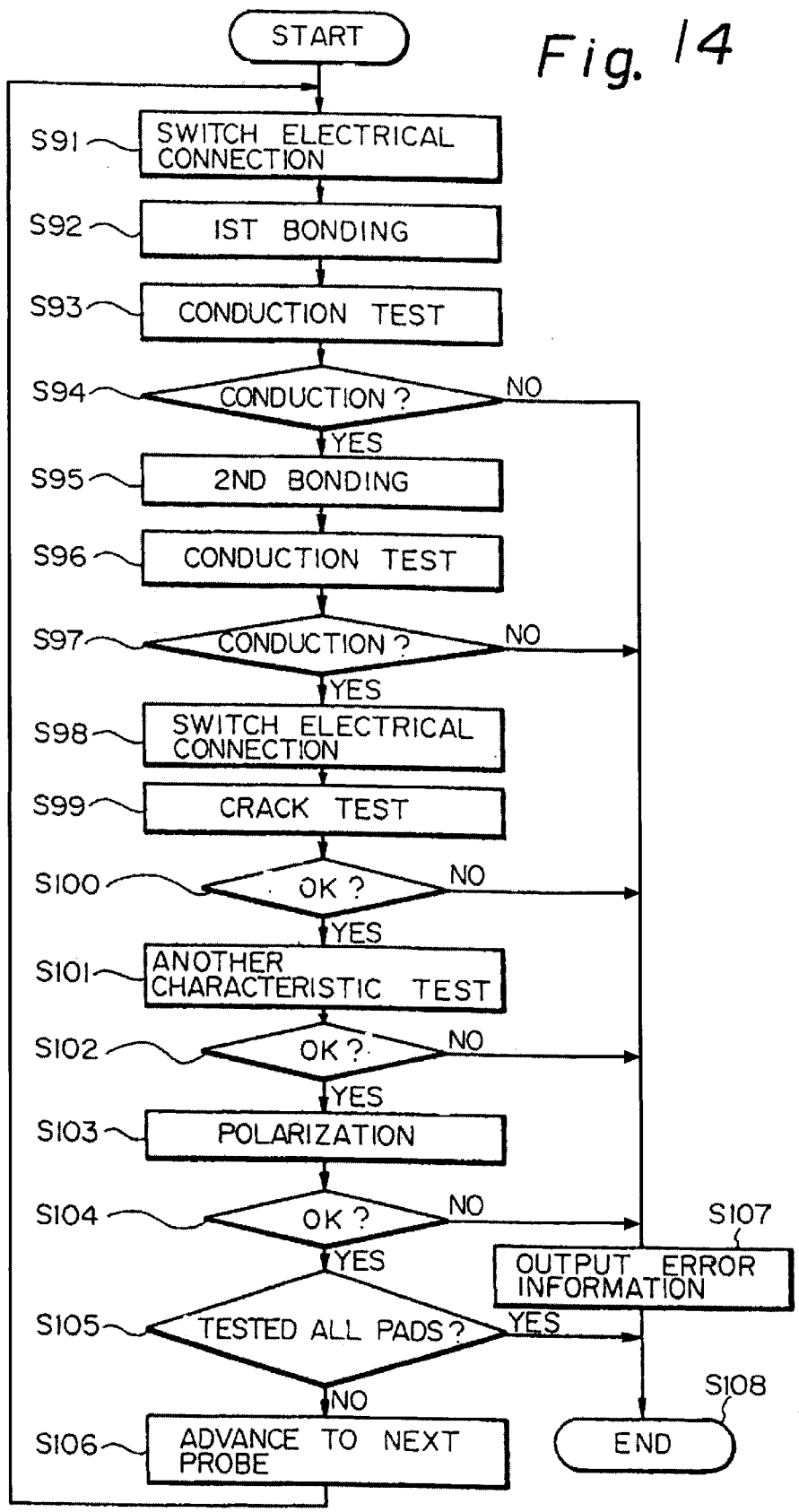

FIG. 14 shows the first bonding, second bonding and crack test (steps S63–S69, FIG. 11) in detail. As shown, the switches A–D are controlled to change the electrical connection (step S91). This is followed by the first bonding and conduction test (steps S92 and S93). If the result of conduction test is satisfactory (Y, step S94), then the second bonding and conduction test are effected (steps S95 and S96). If the result of conduction test following the second bonding is satisfactory (Y, step S97), then the switches A–D are controlled to change the electrical connection (step S98). Subsequently, whether or not cracks are present in the solid actuator is determined (step S99). If no cracks are present (Y, step S100), then the characteristic test and polarization are sequentially executed (steps S101, S102, S103 and S104). The steps described so far are executed with the electrode layers of each two nearby grooves (steps S105 and S106). That is, such steps are sequentially executed with the probes 103b, 103c and so forth and pads 101b, 101c and so forth. When the procedure is completed with all the probes (Y, step S105), then the routine shown in FIG. 14 ends.

If the answer of the step S94 or S97 is N, then the procedure ends while producing error information (steps S107 and S108). This is also true when any crack is detected in the solid actuator (N, step S100), when the result of the second characteristic measurement is not satisfactory (N, step S102), or when the result of polarization is not satisfactory (N, step S104).

It is to be noted that the crack test, second characteristic test and polarization test may be effected in the order opposite to the above order.

A storage medium storing a control program for executing the procedures shown in FIGS. 11–14 may be prepared in order to control the switches of FIG. 5 in the above-described manner. The storage medium may be implemented by any one of a semiconductor memory, a magnetic disk and other conventional media, although not shown in FIG. 5. Further, a computer may be controlled by such a program so as to execute the procedures shown and described.

In summary, in accordance with the present invention, tests relating to electrical connection, actuator characteristic, polarization and so forth are effected at the same time as bonding with probes contacting bonding pads. This enhances rapid production of a solid actuator and simplifies a production line. In addition, bonding is interrupted as soon as any defect is found, so that the subsequent wasteful production is obviated.

Various modifications will become possible for those skilled in the art after receiving the teachings of the present disclosure without departing from the scope thereof.

What is claimed is:

1. An apparatus for bonding wires and testing electrical characteristics of a solid actuator, comprising:
   (a) bonding means for bonding a first wire to a first pad and a second pad formed on a substrate of the solid actuator;
   (b) conduction testing means for testing conduction of the first wire connecting the first and second pads;
   (c) capacitance testing means for determining, after a conduction test effected by said conduction testing means in paragraph (b), whether or not a capacitance between the first and second pads and a ground pad has a preselected value;
   (d) said bonding means operative after conduction testing and capacitance testing in paragraphs (b) and (c) for bonding a second wire to a third pad and a fourth pad formed on said substrate of the solid actuator;

(e) said conduction testing means operative for testing conduction of the second wire connecting the third and fourth pads; and (f) said capacitance testing means operative for determining, after a conduction test effected by said conduction testing means in paragraph (e) whether or not a capacitance between the third and fourth pads and said ground pad has a preselected value.

2. An apparatus as claimed in claim 1, wherein said conduction testing means includes a resistance meter connected between the first wire and the first and second pads.

3. An apparatus as claimed in claim 2, wherein the solid actuator comprises an ink jet head included in a printer.

4. An apparatus as claimed in claim 1, wherein said capacitance testing means includes a capacitance meter connected between the first and second pads and the ground pad.

5. An apparatus for bonding wires and testing electrical characteristics of a solid actuator, comprising:

(a) bonding means for bonding a first wire to a first pad and a second pad formed on a substrate of the solid actuator;

(b) conduction testing means for testing conduction of the first wire connecting the first and second pads;

(c) characteristic testing means for determining, after a conduction test effected by said conduction testing means in paragraph (b), whether or not a characteristic impedance between the first and second pads and a ground pad has a pre-selected value;

(d) said bonding means operative after conduction testing and characteristic impedance testing in paragraphs (b) and (c) for bonding a second wire to a third pad and a fourth pad formed on said substrate of the solid actuator;

(e) said conduction testing means operative for testing conduction of the second wire connecting the third and fourth pads; and (f) said characteristic testing means operative for determining, after a conduction test effected by said conduction testing means in paragraph (e), whether or not a characteristic impedance between the third and fourth pads and a ground pad has a pre-selected value.

6. An apparatus as claimed in claim 5, wherein said conduction testing means includes a resistance meter connected between the first wire and the first and second pads.

7. An apparatus as claimed in claim 5, wherein said characteristic testing means includes an impedance analyzer connected between said first and second pads and the ground pad.

8. An apparatus as claimed in claim 5, wherein the solid actuator comprises an ink jet head included in a printer.

9. An apparatus for bonding wires and testing electrical characteristics of a solid actuator, comprising:

(a) bonding means for bonding a first wire to a first pad and a second pad formed on a substrate of the solid actuator;

(b) conduction testing means for testing conduction of the first wire connecting the first and second pads;

(c) crack testing means for determining, after a conduction test effected by said conduction testing means in paragraph (b), whether or not cracks are present in surfaces of electrode layers respectively electrically connected to the first and second pads and driven from outside of the solid actuator;

(d) said bonding means operative after conduction testing and crack testing in paragraphs (b) and (c) for bonding a second wire to a third pad and a fourth pad formed on said substrate of the solid actuator;

(e) said conduction testing means operative for testing conduction of the second wire connecting the third and fourth pads; and (f) said crack testing means operative for determining, after a conduction test effected by said conduction testing means in paragraph (e) whether or not cracks are present in surfaces of electrode layers respectively electrically connected to the third and fourth pads and driven from outside of the solid actuator.

10. An apparatus as claimed in claim 9, wherein said conduction testing means includes a resistance meter connected between the wire and the first and second pads.

11. An apparatus as claimed in claim 9, wherein the solid actuator comprises an ink jet head included in a printer.

12. An apparatus for bonding wires and testing electrical characteristics of a solid actuator, comprising:

(a) bonding means for bonding a first wire to a first pad and a second pad formed on a substrate of the solid actuator;

(b) conduction testing means for testing conduction of the first wire connecting the first and second pads;

(c) polarizing means for polarizing the substrate after a conduction test effected by said conduction testing means;

(d) said bonding means operative after conduction testing and polarizing in paragraphs (b) and (c) for bonding a second wire to a third pad and a fourth pad formed on said substrate of the solid actuator;

(e) said conduction testing means operative for testing conduction of the second wire connecting the third and fourth pads; and (f) said polarizing means operative for polarizing the substrate after a conduction test effected by said conduction testing means in paragraph (e).

13. An apparatus as claimed in claim 12, wherein said conduction testing means includes a resistance meter connected between the first wire and the first and second pads.

14. An apparatus as claimed in claim 12, wherein the solid actuator comprises an ink jet head included in a printer.

15. An apparatus for bonding wires and testing electrical characteristics of a solid actuator, comprising:

bonding means for bonding a wire to a first pad and a second pad formed on a substrate of the solid actuator;

conduction testing means for testing conduction of the wire connecting the first and second pads;

capacitance testing means for determining, after a conduction test effected by said conduction testing means, whether or not a capacitance between the first and second pads and a ground pad has a preselected value;

characteristic testing means for determining, after a capacity test effected by said capacitance testing means, whether or not a characteristic impedance between the first and second pads and the ground pad has a preselected value;

crack testing means for determining, after a characteristic impedance test effected by said characteristic testing means, whether or not cracks are present in surfaces of electrode layers respectively electrically connected to the first and second pads and driven from an outside of the solid actuator; and polarizing means for polarizing the substrate after a crack test effected by said crack testing means.

16. An apparatus as claimed in claim, 15, wherein said conduction testing means includes a resistance meter connected between the wire and the first and second pads.

17. An apparatus as claimed in claim 15, wherein the solid actuator comprises an ink jet head included in a printer.

18. An apparatus for bonding wires and testing electrical characteristics of a solid actuator, comprising:
- (a) bonding means for bonding a first wire to a first pad and a second pad formed on a substrate of the solid actuator;
- (b) conduction testing means for testing conduction of the first wire connecting the first and second pads;
- (c) short-circuit testing means for determining, before a conduction test effected by said conduction testing means, whether or not the first and second pads and a ground pad are short-circuited;
- (d) said bonding means operative after conduction testing and short-circuit testing in paragraphs (b) and (c) for bonding a second wire to a third pad and a fourth pad formed on said substrate of the solid actuator;
- (e) said conduction testing means operative for testing conduction of the second wire connecting the third and fourth pads; and
- (f) said short circuit testing means operative for determining, before a conduction test effected by said conduction testing means in paragraph (e) whether or not the first and second pads and a ground pad are short-circuited.

19. An apparatus as claimed in claim 18, wherein said conduction testing means includes a resistance meter connected between the first wire and the first and second pads.

20. A apparatus as claimed in claim 18, wherein the solid actuator comprises an ink jet head included in a printer.

21. An apparatus for bonding wires and testing electrical characteristics of a solid actuator, comprising:
- (a) bonding means for bonding a first wire to a first pad and a second pad formed on a substrate of the solid actuator;
- (b) conduction testing means for testing conduction of the first wire connecting the first and second pads;
- (c) capacitance testing means for determining, before a conduction test effected by said conduction testing means, whether or not a capacitance between the first and second pads and a ground pad has a preselected value;
- (d) said bonding means operative after conduction testing and capacitance testing in paragraphs (b) and (c) for bonding a second wire to a third pad and a fourth pad formed on said substrate of the solid actuator;
- (e) said conduction testing means operative for testing conduction of the second wire connecting the third and fourth pads; and
- (f) said capacitance testing means operative for determining, before a conduction test effected by said conduction testing means in paragraph (e) whether or not a capacitance between the third and fourth pads and said ground pad has a preselected value.

22. An apparatus as claimed in claim 21, wherein said conduction testing means includes a resistance meter connected between the first wire and the first and second pads.

23. An apparatus as claimed in claim 21, wherein the solid actuator comprises an ink jet head included in a printer.

24. An apparatus for bonding wires and testing electrical characteristics of a solid actuator, comprising:
- (a) bonding means for bonding a first wire to a first pad and a second pad formed on a substrate of the solid actuator;
- (b) conduction testing means for testing conduction of the first wire connecting the first and second pads;
- (c) characteristic testing means for determining, before a conduction test effected by said conduction testing means, whether or not a characteristic impedance between the first and second pads and a ground pad has a pre-selected value;
- (d) said bonding means operative after conduction testing and characteristic impedance testing in paragraphs (b) and (c) for bonding a second wire to a third pad and a fourth pad formed on said substrate of the solid actuator;
- (e) said conduction testing means operative for testing conduction of the second wire connecting the third and fourth pads; and
- (f) said characteristic testing means operative for determining, before a conduction test effected by said conduction testing means in paragraph (e), whether or not a characteristic impedance between the third and fourth pads and a ground pad has a pre-selected value.

25. An apparatus as claimed in claim 24, wherein said conduction testing means includes a resistance meter connected between the first wire and the first and second pads.

26. An apparatus as claimed in claim 24, wherein the solid actuator comprises an ink jet head included in a printer.

27. A method of bonding wires and testing electrical characteristics of a solid actuator, comprising the steps of:
- (a) bonding a first wire to a first pad and a second pad formed on one or more substrates of the solid actuator;
- (b) performing a first conduction test of the first wire connecting the first and second pads;
- (c) determining, after the first conduction test, whether or not a capacitance between the first and second pads and a ground pad has a pre-selected value;
- (d) bonding a second wire to a third pad and a fourth pad formed on said one or more substrates of the solid actuator;
- (e) performing a second conduction test of the second wire connecting the third and fourth pads; and
- (f) determining, after the second conduction test in paragraph (e), whether or not a capacitance between the third and fourth pads and said ground pad has a pre-selected value.

28. A method as claimed in claim 27, wherein the first conduction test is effected with a resistance meter connected between the first wire and the first and second pads.

29. A method as claimed in claim 27, wherein a capacitance test is effected with a capacitance meter connected between said first and second pads and the ground pad.

30. A method as claimed in claim 27, wherein the solid actuator comprises an ink jet head included in a printer.

31. A method of bonding wires and testing electrical characteristics of a solid actuator, comprising the steps of:
- (a) bonding a first wire to a first pad and a second pad formed on one or more substrates of the solid actuator;
- (b) performing a first conduction test of the first wire connecting the first and second pads;
- (c) determining, after the first conduction test, whether or not a characteristic impedance between the first and second pads and a ground pad has a pre-selected value;
- (d) bonding a second wire to a third pad and a fourth pad formed on the one or more substrates of the solid actuator;
- (e) performing a second conduction test of the second wire connecting the third and fourth pads; and
- (f) determining, after the second conduction test in paragraph (e), whether or not a characteristic impedance between the third and fourth pads and a ground pad has a pre-selected value.

32. A method as claimed in claim 31, wherein the first conduction test is effected with a resistance meter connected between the first wire and the first and second pads.

33. A method as claimed in claim 31, wherein a characteristic test is effected with an impedance analyzer connected between the first and second pads and the ground pad.

34. A method as claimed in claim 31, wherein the solid actuator comprises an ink jet head included in a printer.

35. A method of bonding wires and testing electrical characteristics of a solid actuator, comprising the steps of:
   (a) bonding a first wire to a first pad and a second pad formed on one or more substrates of the solid actuator;
   (b) performing a first conduction test of the first wire connecting the first and second pads;
   (c) determining, after the first conduction test, whether or not cracks are present in surfaces of electrode layers respectively electrically connected to the first and second pads and driven from outside of the solid actuator;
   (d) bonding a second wire to a third pad and a fourth pad formed on said one or more substrates of the solid actuator;
   (e) performing a second conduction test of the second wire connecting the third and fourth pads; and
   (f) determining, after the second conduction test in paragraph (e), whether or not cracks are present in surfaces of electrode layers respectively electrically connected to the third and fourth pads and driven from outside of the solid actuator.

36. A method as claimed in claim 35, wherein the conduction test is effected with a resistance meter connected between the wire and the first and second pads.

37. A method as claimed in claim 35, wherein the solid actuator comprises an ink jet head included in a printer.

38. A method of bonding wires and testing electrical characteristics of a solid actuator, comprising the steps of:
   (a) bonding a first wire to a first pad and a second pad formed on one or more substrates of the solid actuator;
   (b) performing a first conduction test of the first wire connecting the first and second pads;
   (c) polarizing the substrate after the first conduction test;
   (d) bonding a second wire to a third pad and a fourth pad formed on the one or more substrates of the solid actuator;
   (e) performing a second conduction test of the second wire connecting the third and fourth pads; and
   (f) polarizing the one or more substrates after the second conduction test in paragraph (e).

39. A method as claimed in claim 38, wherein the first conduction test is effected with a resistance meter connected between the first wire and the first and second pads.

40. A method as claimed in claim 38, wherein the solid actuator comprises an ink jet head included in a printer.

41. A method of bonding wires and testing electrical characteristics of a solid actuator, comprising:
   bonding a wire to a first pad and a second pad formed on a substrate of the solid actuator;
   testing conduction of the wire connecting the first and second pads;
   determining, after a conduction test, whether or not a capacitance between the first and second pads and a ground pad has a preselected value;
   determining, after a capacitance test, whether or not a characteristic impedance between the first and second pads and the ground pad has a preselected value;
   determining, after a characteristic impedance test, whether or not cracks are present in surfaces of electrode layers respectively electrically connected to the first and second pads and driven from an outside of the solid actuator; and
   polarizing the substrate after a crack test.

42. A method as claimed in claim 41, wherein the conduction test is effected with a resistance meter connected between the wire and the first and second pads.

43. A method of bonding wires and testing electrical characteristics of a solid actuator, comprising the steps of:
   (a) bonding a first wire to a first pad and a second pad formed on one or more substrates of the solid actuator;
   (b) performing a first conduction test of the first wire connecting the first and second pads;
   (c) determining, before the first conduction test, whether or not the first and second pads and a ground pad are short-circuited;
   (d) bonding a second wire to a third pad and a fourth pad formed on the one or more substrates of the solid actuator;
   (e) performing a second conduction test of the second wire connecting the third and fourth pads; and
   (f) determining, before the second conduction test of paragraph (e), whether or not the third and fourth pads and a ground pad are short circuited.

44. A method as claimed in claim 43, wherein the first conduction test is effected with a resistance meter connected between the first wire and the first and second pads.

45. A method as claimed in claim 43, wherein the solid actuator comprises an ink jet head included in a printer.

46. A method of bonding wires and testing electrical characteristics of a solid actuator, comprising the steps of:
   (a) bonding a first wire to a first pad and a second pad formed on one or more substrates of the solid actuator;
   (b) performing a first conduction test of the first wire connecting the first and second pads;
   (c) determining, before the first conduction test, whether or not a capacitance between the first and second pads and a ground pad has a pre-selected value;
   (d) bonding a second wire to a third pad and a fourth pad formed on said one or more substrates of the solid actuator;
   (e) performing a second conduction test of the second wire connecting the third and fourth pads; and
   (f) determining, before the second conduction test in paragraph (e), whether or not a capacitance between the third and fourth pads and a ground pad has a preselected value.

47. A method as claimed in claim 46, wherein the first conduction test is effected with a resistance meter connected between the first wire and the first and second pad.

48. A method as claimed in claim 46, wherein the solid actuator comprises an ink jet head included in a printer.

49. A method of bonding wires and testing electrical characteristics of a solid actuator, comprising the steps of:
   (a) bonding a first wire to a first pad and a second pad formed on one or more substrates of the solid actuator;
   (b) performing a first conduction test of the first wire connecting the first and second pads;
   (c) determining, before the first conduction test, whether or not a characteristic impedance between the first and second pads and a ground pad has a pre-selected value;
   (d) bonding a second wire to a third pad and a fourth pad formed on said one or more substrates of the solid actuator;

(e) performing a second conduction test of the second wire connecting the third and fourth pads; and (f) determining, before the second conduction test in paragraph (e), whether or not a characteristic impedance between the third and fourth pads and a ground pad has a pre-selected value.

50. A method as claimed in claim 49, wherein the first conduction test is effected with a resistance meter connected between the first wire and the first and second pad.

51. A method as claimed in claim 49, wherein the solid actuator comprises an ink jet head included in a printer.

52. A computer readable storage medium storing a control program for controlling an apparatus for bonding wires and testing electrical characteristics of a solid actuator, said control program causing the apparatus to perform a process comprising:

bonding a first wire to a first pad and a second pad formed on one or more substrates of the solid actuator;

testing conduction of the first wire connecting the first and second pads;

determining whether or not a capacitance between the first and second pads and a ground pad has a preselected value;

bonding a second wire to a third pad and a fourth pad formed on said one or more substrates of the solid actuator;

testing conduction of the second wire connecting the third and fourth pads; and determining whether a capacitance between the third and fourth pads and said ground pad has a pre-selected value.

53. A storage medium as claimed in claim 52, wherein conduction is tested using a resistance meter connected between the first wire and the first and second pads.

54. A storage medium as claimed in claim 52, wherein capacitance is determined using a capacitance meter connected between the first and second pads and the ground pad.

55. A storage medium as claimed in claim 52, wherein the solid actuator comprises an ink jet head included in a printer.

56. A computer readable storage medium storing a control program for controlling an apparatus for bonding wires and testing electrical characteristics of a solid actuator, said control program causing the apparatus to perform a process comprising:

bonding a first wire to a first pad and a second pad formed on one or more substrates of the solid actuator;

testing conduction of the first wire connecting the first and second pads;

determining whether a characteristic impedance between the first and second pads and a first ground pad has a preselected value;

bonding a second wire to a third pad and a fourth pad formed on said one or more substrates of the solid actuator;

testing conduction of the second wire connecting the third and fourth pads; and determining whether a characteristic impedance between the third and fourth pads and a second ground pad has a pre-selected value.

57. A storage medium as claimed in claim 56, wherein conduction is tested using a resistance meter connected between the first wire and the first and second pads.

58. A storage medium as claimed in claim 56, wherein characteristic impedance is tested using an impedance analyzer connected between the first and second pads and the first ground pad.

59. A storage medium as claimed in claim 56, wherein the solid actuator comprises an ink jet head included in a printer.

60. A computer readable storage medium storing a control program for controlling an apparatus for bonding wires and testing electrical characteristics of a solid actuator, said control program causing the apparatus to perform a process comprising:

bonding a first wire to a first pad and a second pad formed on one or more substrates of the solid actuator;

testing conduction of the first wire connecting the first and second pads;

determining whether cracks are present in surfaces of electrode layers respectively electrically connected to the first and second pads and driven from outside of the solid actuator;

bonding a second wire to a third pad and a fourth pad formed on said one or more substrates of the solid actuator;

testing conduction of the second wire connecting the third and fourth pads; and determining whether cracks are present in surfaces of electrode layers respectively electrically connected to the third and fourth pads and driven from outside of the solid actuator.

61. A storage medium as claimed in claim 60, wherein conduction is tested using a resistance meter connected between the first wire and the first and second pads.

62. A storage medium as claimed in claim 60, wherein the solid actuator comprises an ink jet head included in a printer.

63. A computer readable storage medium storing a control program for controlling an apparatus for bonding wires and testing electrical characteristics of a solid actuator, said control program causing the apparatus to perform a process comprising:

bonding a first wire to a first pad and a second pad formed on one or more substrates of the solid actuator;

testing conduction of the first wire connecting the first and second pads;

polarizing the one or more substrates;

bonding a second wire to a third pad and a fourth pad formed on said one or more substrates of the solid actuator;

testing conduction of the second wire connecting the third and fourth pads; and polarizing one or more substrates after the conduction test.

64. A storage medium as claimed in claim 63, wherein conduction is tested using a resistance meter connected between the first wire and the first and second pads.

65. A storage medium as claimed in claim 63, wherein the solid actuator comprises an ink jet head included in a printer.

66. The computer readable storage medium storing a control program for controlling an apparatus for bonding wires and testing electrical characteristics of a solid actuator, said control program causing the apparatus to perform a process comprising:

bonding a wire to a first pad and a second pad formed on one or more substrates of the solid actuator;

testing conduction of the wire connecting the first and second pads;

determining whether a capacitance between the first and second pads and a ground pad has a preselected value;

determining whether a characteristic impedance between the first and second pads and the ground pad has a preselected value;

determining whether cracks are present in surfaces of electrode layers respectively electrically connected to the first and second pads and driven from an outside of the solid actuator; and polarizing the one or more substrates.

67. A storage medium as claimed in claim 66, wherein conduction is tested using a resistance meter connected between the wire and the first and second pads.

68. A storage medium as claimed in claim 66, wherein the solid actuator comprises an ink jet head included in a printer.

69. A computer readable storage medium storing a control program for controlling an apparatus for bonding wires and testing electrical characteristics of a solid actuator, said control program causing the apparatus to perform a process comprising:

bonding a first wire to a first pad and a second pad formed on one or more substrates of the solid actuator;

testing conduction of the first wire connecting the first and second pads;

determining whether the first and second pads and a ground pad are short-circuited;

bonding a second wire to a third pad and a fourth pad formed on said one or more substrates of the solid actuator;

testing conduction of the second wire connecting the third and fourth pads; and determining whether the third and fourth pads and a ground pad are short-circuited.

70. A storage medium as claimed in claim 69, wherein conduction is tested using a resistance meter connected between the first wire and the first and second pads.

71. A storage medium as claimed in claim 69, wherein the solid actuator comprises an ink jet head included in a printer.

72. A computer readable storage medium storing a control program for controlling an apparatus for bonding wires and testing electrical characteristics of a solid actuator, said control program causing the apparatus to perform a process comprising:

bonding a first wire to a first pad and a second pad formed on one or more substrates of the solid actuator;

testing conduction of the first wire connecting the first and second pads;

determining whether a capacitance between the first and second pads and a ground pad has a preselected value;

bonding a second wire to a third pad and a fourth pad formed on said one or more substrates of the solid actuator;

testing conduction of the second wire connecting the third and fourth pads; and determining whether a capacitance between the third and fourth pads and said ground pad has a pre-selected value.

73. A storage medium as claimed in claim 72, wherein conduction is tested using a resistance meter connected between the first wire and the first and second pads.

74. A storage medium as claimed in claim 72, wherein the solid actuator comprises an ink jet head included in a printer.

75. A computer readable storage medium storing a control program for controlling an apparatus for bonding wires and testing electrical characteristics of a solid actuator, said control program causing the apparatus to perform a process of:

bonding a first wire to a first pad and a second pad formed on one or more substrates of the solid actuator;

testing conduction of the first wire connecting the first and second pads;

determining whether a characteristic impedance between the first and second pads and a ground pad has a pre-selected value;

bonding a second wire to a third pad and a fourth pad on the one or more substrates of the solid actuator;

testing conduction of the second wire connecting the third and fourth pads; and determining whether a characteristic impedance between the third and fourth pads and a ground pad has a pre-selected value.

76. A storage medium as claimed in claim 75, wherein conduction is tested using a resistance meter connected between the first wire and the first and second pads.

77. A storage medium as claimed in claim 75, wherein the solid actuator comprises an ink jet head included in a printer.

78. A method of bonding wires and testing electrical characteristics of a solid actuator, comprising the steps of:

bonding a wire to a first pad and a second pad formed on a substrate of the solid actuator;

testing conduction of the wire connecting the first and second pads;

conducting a crack test by determining after a conduction test whether or not cracks are present in surfaces of electrode layers respectively electrically connected to the first and second pads and driven from outside of the solid actuator; and wherein the crack test is effected with a curve-tracer connected to the electrode layers.

79. A computer readable storage medium storing a control program for controlling an apparatus for bonding wires and testing electrical characteristics of a solid actuator, said control program causing the apparatus to perform a process of:

bonding a wire to a first pad and a second pad formed on one or more substrates of the solid actuator;

testing conduction of the wire connecting the first and second pads;

determining after a conduction test whether cracks are present in surfaces of electrode layers respectively electrically connected to the first and second pads and driven from outside of the solid actuator; and wherein a curve tracer is connected to the electrode layers to determine whether cracks are present.

* * * * *